US010551223B2

(12) United States Patent
Cusey et al.

(10) Patent No.: US 10,551,223 B2
(45) Date of Patent: Feb. 4, 2020

(54) METHOD AND APPARATUS FOR CONFIGURABLE PHOTODETECTOR ARRAY PATTERNING FOR OPTICAL ENCODERS

(71) Applicant: TT Electronics PLC, Carrollton, TX (US)

(72) Inventors: James Cusey, Carrollton, TX (US); Stepan Illasevitch, Plano, TX (US); Benjamin Mak, Carrollton, TX (US); Bharath Mandyam, Carrollton, TX (US); Brent Hans Larson, Carrollton, TX (US)

(73) Assignee: TT ELECTRONICS PLC, Carrollton, TX (US)

( * ) Notice: Subject to any disclaimer, the term of this patent is extended or adjusted under 35 U.S.C. 154(b) by 100 days.

(21) Appl. No.: 15/681,182

(22) Filed: Aug. 18, 2017

(65) Prior Publication Data

US 2018/0266852 A1 Sep. 20, 2018

Related U.S. Application Data

(60) Provisional application No. 62/473,525, filed on Mar. 20, 2017.

(51) Int. Cl.
*G01D 5/347* (2006.01)
*G01D 5/38* (2006.01)
(Continued)

(52) U.S. Cl.
CPC .............. *G01D 5/347* (2013.01); *G01D 5/12* (2013.01); *G01D 5/38* (2013.01); *H01L 31/164* (2013.01)

(58) Field of Classification Search
CPC ...... G01D 5/347; G01D 5/34715; G01D 5/12; G01D 5/38; H01L 27/14; H01L 31/164; H01L 27/1446
(Continued)

(56) References Cited

U.S. PATENT DOCUMENTS 6,501,905 B1 12/2002 Kimura
6,727,493 B2 * 4/2004 Franklin ................. G01D 5/34
250/231.13
(Continued)

FOREIGN PATENT DOCUMENTS

EP 1 308 700 7/2003
TW 201534871 9/2015

OTHER PUBLICATIONS

PCT, Notification of Transmittal of the International Search Report and the Written Opinion of the International Searching Authority, or the Declaration, Application No. PCT/US2017/060705, dated Feb. 12, 2018, 15 pages.
(Continued)

*Primary Examiner* — Seung C Sohn
(74) *Attorney, Agent, or Firm* — Haynes and Boone, LLP (57) ABSTRACT

An encoder system includes a configurable detector array, wherein the configurable detector array includes a plurality of detectors. In an embodiment, the encoder system includes an application-specific integrated circuit (ASIC). The encoder system may also include a memory operable to store a partition map that defines a state for each of the plurality of detectors. In an embodiment, the memory includes a non-volatile memory. The encoder system may also include a controller, such as a microcontroller, operable to read from the memory the partition map and to configure the configurable detector array according to the configuration map. The encoder system may also include an emitter operable to generate a flux modulated by a motion object, wherein the configurable detector array is operable to receive the flux and generate respective current outputs for each of the detectors in response to the flux.

20 Claims, 11 Drawing Sheets

(51) Int. Cl.
*G01D 5/12* (2006.01)
*H01L 31/16* (2006.01)

(58) Field of Classification Search
USPC .................................... 250/231.13–231.18
See application file for complete search history.

(56) References Cited

U.S. PATENT DOCUMENTS

| | | |
|---|---|---|
| 6,928,386 B2 | 8/2005 | Hasser |
| 7,199,354 B2 * | 4/2007 | Mayer .................... G01D 5/347 250/231.13 |
| 7,381,942 B2 * | 6/2008 | Chin .................. G01D 5/34792 250/208.2 |
| 7,619,210 B2 | 11/2009 | Wong et al. |
| 8,169,619 B2 | 5/2012 | Oberhauser |
| 8,674,287 B2 * | 3/2014 | Yoshida ................. G01D 5/145 250/231.13 |
| 8,729,458 B2 * | 5/2014 | Kato .................. G01D 5/24476 250/231.1 |
| 2007/0003225 A1 | 1/2007 | Moteki et al. |
| 2012/0104236 A1 | 5/2012 | Thor et al. |
| 2012/0155532 A1 | 6/2012 | Puri et al. |
| 2016/0020168 A1 | 1/2016 | Kao et al. |

OTHER PUBLICATIONS

Office Action and Search Report (including translations) dated Sep. 5, 2019, TW Application No. 108104828, 7 pages.

* cited by examiner

Quadrature-Track Pixel Array

Index-Track Pixel Array

Fig. 10A

Quadrature-Track Pixel Partition    Index-Track Pixel Partition

METHOD AND APPARATUS FOR CONFIGURABLE PHOTODETECTOR ARRAY PATTERNING FOR OPTICAL ENCODERS

PRIORITY

This application claims the benefit of U.S. Prov. App. No. 62/473,525 entitled "Method and Apparatus for Configurable Photodetector Array Patterning for Optical Encoders," filed Mar. 20, 2017, herein incorporated by reference in its entirety.

BACKGROUND

An encoder system, such as an optical encoder, may include an electro-mechanical device that detects and converts positions (e.g., linear and/or angular positions) of an object to analog or digital output signals by using one or more photodetectors. There are different types of optical encoders, such as rotary encoders and linear encoders. Manufacturers of rotary and/or linear encoders traditionally require a different integrated circuit (IC) design for each different code wheel (for rotary encoders) or code strip (for linear encoders) configuration (radius and pulses-per-revolution for rotary encoders, pulses-per-unit-length for linear encoders, and/or slit shapes) they deploy. For manufacturers that make many different encoder modules in low-to-moderate volume with configurations, this necessitates the purchase of a portfolio of different ICs in low-to-moderate volume. This results in a higher cost and a need of more complex supply chain than would be needed if the same IC may be used for multiple encoder modules regardless of code wheel or code strip configurations.

Accordingly, improvements in the encoder system are desired.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. Any alterations and further modifications to the described devices, systems, methods, and any further application of the principles of the present disclosure are fully contemplated as would normally occur to one having ordinary skill in the art to which the disclosure relates. For example, the features, components, and/or steps described with respect to one embodiment may be combined with the features, components, and/or steps described with respect to other embodiments of the present disclosure to form yet another embodiment of a device, system, or method according to the present disclosure even though such a combination is not explicitly shown. Further, for the sake of simplicity, in some instances the same reference numerals are used throughout the drawings to refer to the same or like parts.

The present disclosure is generally related to optical detection system and methods thereof, more particularly to an optical encoder with a configurable photodetector array and methods for detecting and converting position information of a target object to analog or digital output signals. For the purposes of simplicity, the embodiments described herein will use a code wheel (for rotary encoders) as an example of the target object, although the scope of embodiments may include any suitable optical detection of moving objects. For example, the principles in the present disclosure can also be used for detecting linear movements (e.g., a code strip for linear encoders). Various embodiments of the present disclosure enable the use of a single IC design for encoder modules of varying configurations without significant degradation of output signal quality, thus enabling the lower cost arising from higher volume and a simpler supply chain resulting from needing to manage fewer IC part numbers.

Additionally, other embodiments may employ a magnetic detector. However, for ease of illustration, the embodiments described herein focus on optical detection, and it is understood that such principles may be applied to magnetic detection systems.

Figure 1:
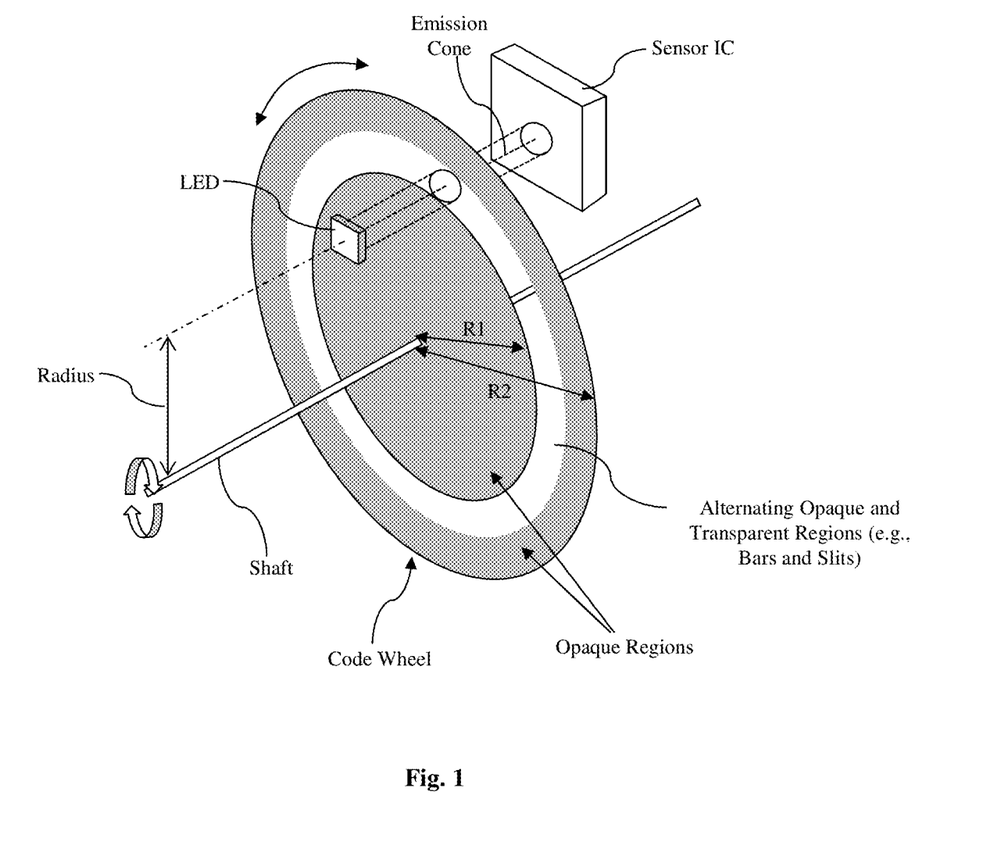
FIG. 1 is an illustration of an example transmissive optical encoder, in accordance with some embodiments.

Optical encoders may include incremental encoders that are used to track motion and can be used to determine position and velocity. This can be either linear or rotary motion. Because the direction can be determined, very accurate measurements can be made. FIG. 1 depicts an embodiment of a transmissive rotary optical encoder. Within FIG. 1, the region of a code wheel labeled "alternating opaque and transparent regions" consists of one or more tracks. In this example, a track is the set of all points on the code wheel whose distance from the center of the shaft is between an inner radius R1 and an outer radius R2, and the opaque (e.g., bars) and transparent (e.g., slits) regions of the track are arranged such that the track has discrete rotational symmetry of order N about the shaft center, where N≥1. One such track on an incremental encoder is known as the quadrature track, whose order of rotational symmetry is termed the pulses per revolution (PPR) of the encoder system.

Figure 2:
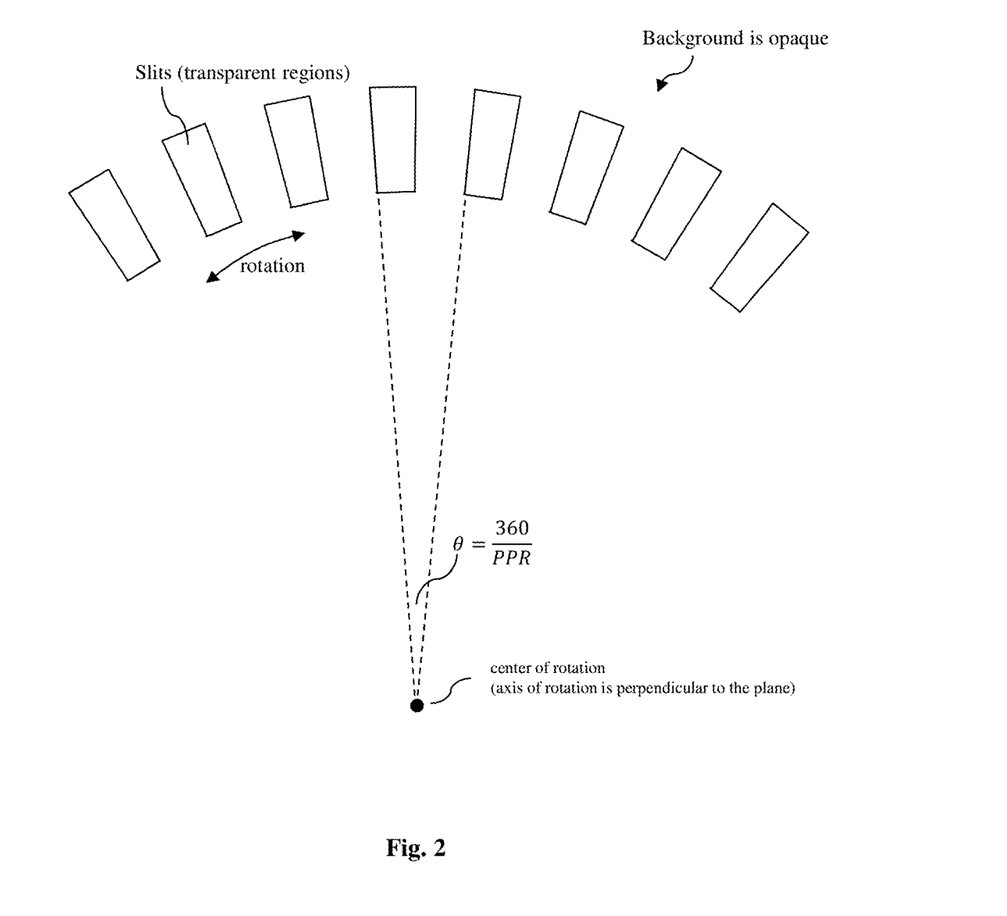
FIG. 2 is an illustration of an example pattern of quadrature-track code wheel slits in a transmissive optical encoder system, in accordance with some embodiments.

FIG. 2 depicts an example embodiment of a quadrature track. The optical sensor integrated circuit (IC) in FIG. 1 contains a plurality of photoactive areas, grouped into regions, such as A+, A−, B+, and B− regions, and aligned to the quadrature track of the code wheel (i.e. at a distance from the axis of code wheel rotation between R1 and R2 of the quadrature track). Each of the A+, A−, B+, and B− regions is composed of one or more discrete photoactive areas connected in parallel (so that the photocurrents of the parallel discrete photoactive areas are additive). A light emitter (e.g., an LED) illuminates lights towards the photoactive areas. The light would be blocked by the opaque regions of the track or pass through the transparent regions and arrive at the photoactive areas.

Figure 3:
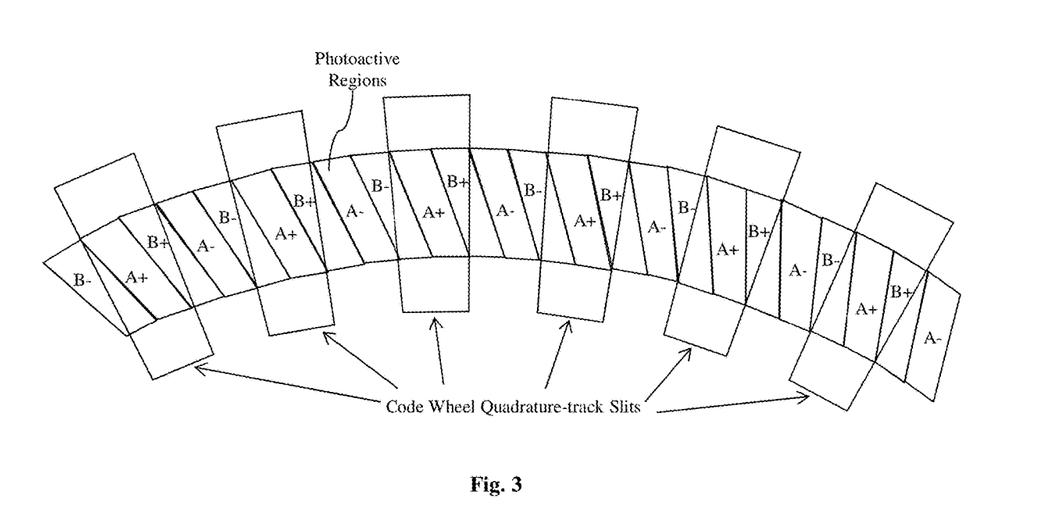
FIG. 3 shows an example embodiment of quadrature assignments (A+, A−, B+, B−) to a photoactive region on an optical sensor IC, superimposed upon a code wheel's quadrature track shown in FIG. 2, in accordance with some embodiments.
Figure 4:
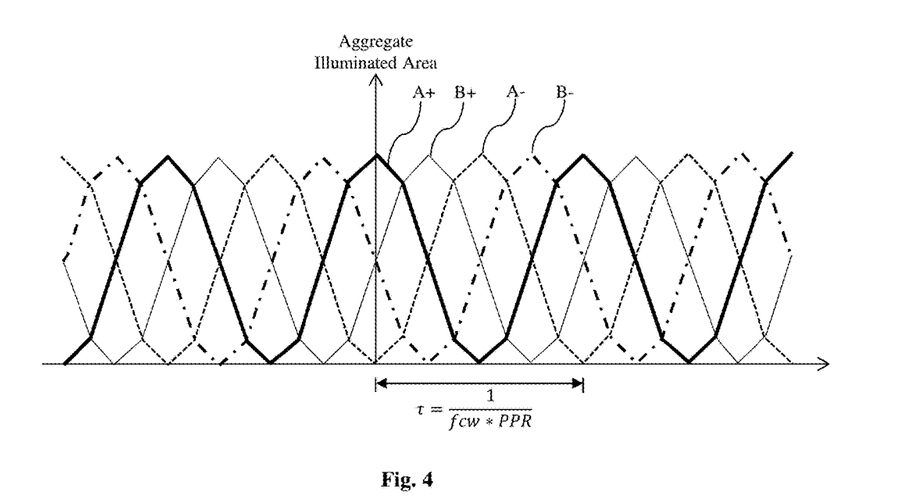
FIG. 4 shows aggregate illuminated areas of A+, A−, B+, B− regions in FIG. 3 when a code wheel is rotated clockwise at a constant rate, in accordance with some embodiments.

FIG. 3 depicts an example embodiment of the A+, A−, B+, and B− regions of the optical sensor IC in a system with part of the code wheel quadrature track superimposed. FIG. 4 depicts the aggregate photocurrents of the A+, A−, B+, and B− regions as depicted in FIG. 3 over a span of time assuming a constant code wheel rotation rate (herein aggregate photocurrent is assumed to be directly proportional to aggregate illuminated area). As can be seen in FIG. 4, the photocurrent waveforms are periodic with period $1/(f_{CW}*PPR)$, where $f_{CW}$ is the rotational frequency of the code wheel and PPR is the order of rotational symmetry of the quadrature track of the code wheel. Moreover, the photocurrent waveforms are approximately sinusoidal and are in quadrature (i.e. equal in magnitude and separated in phase by 90°). The scheme depicted in FIG. 3, where the photoactive areas on the sensor IC alternate spatially between the A+, B+, A−, and B− regions and are closely matched in size and position to the geometries of the slits and bars in the quadrature track of the code wheel, is known as a phased-array design. Because the geometry of the code wheel quadrature-track slits and bars changes if the code wheel configuration (radius and PPR) changes, a phased-array design intended for use with a particular code wheel configuration does not operate properly when used with a different code wheel configuration. Furthermore, different code wheels may have different slit shapes. In the illustrated embodiment, the slit shape is regular, such as a pie-shaped with a radius at each end, and different slits may have an identical slit shape. In various other embodiments, a slit shape may be irregular, while different slits on a same code wheel may further have different shapes. Therefore, manufacturers of incremental encoders traditionally require a different IC design for each different code wheel configuration they deploy. For manufacturers that make many different encoder modules in low-to-moderate volume with configurations, this necessitates the purchase of many different ICs in low-to-moderate volume. This results in a higher cost and more complex supply chain than would be needed if the same IC may be used for multiple encoder modules regardless of configuration.

For example, if a customer normally supports 3 code wheel radii and 4 different PPR per radii, then the customer would have to maintain an inventory of 12 different ASICs (at least in theory). It is therefore desired to enable the use of a single IC design for encoder modules of varying configurations without significant degradation of output signal quality, thus allowing the lower cost arising from higher volume and a simpler supply chain resulting from managing fewer IC part numbers. The principles in this disclosure would allow the customer to inventory a single IC for a multitude of code wheel radii and PPR, generally allowing a lower cost position for the customer due to higher volumes and reduced material handling.

Figure 5:
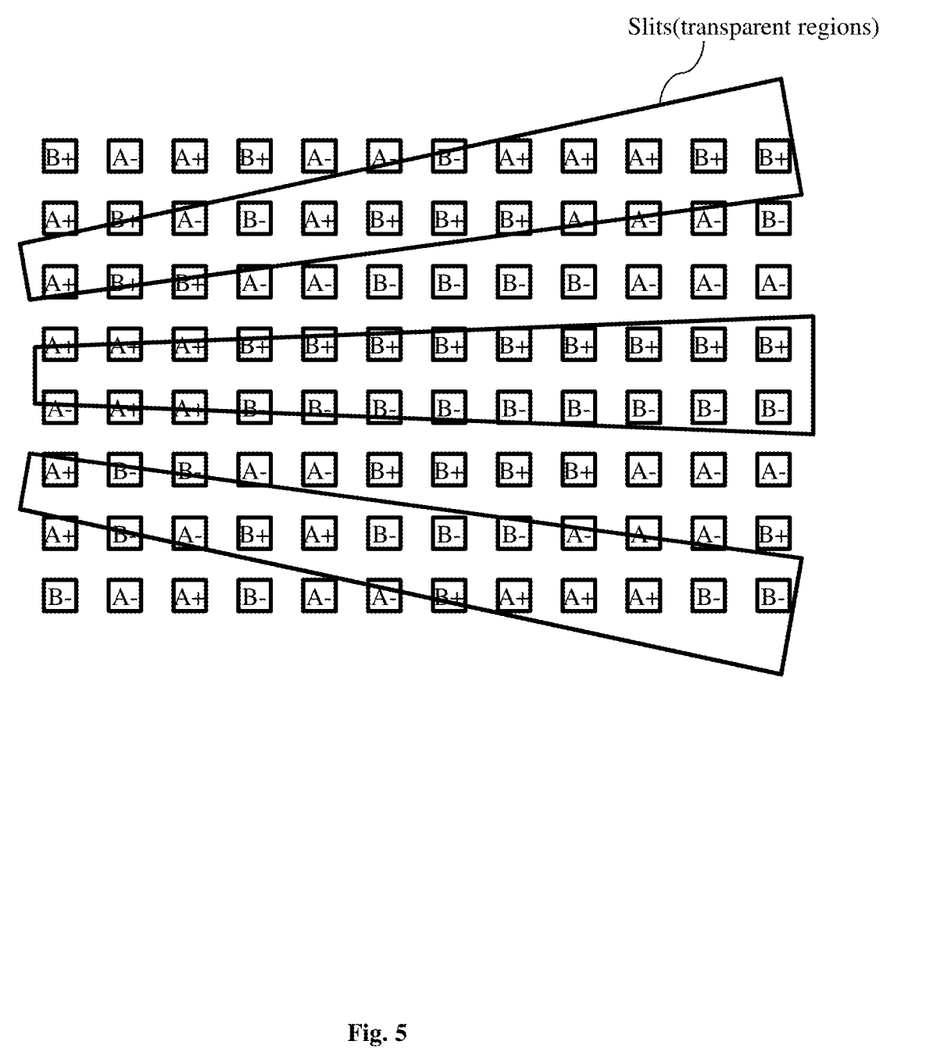
FIG. 5 illustrates an example configurable photodetector array and configured quadrature assignments to photo pixels in the array, superimposed upon a code wheel's quadrature track, in accordance with some embodiments.

FIG. 5 illustrates a configurable photodetector array and an example of configured quadrature assignment to each photodetector in the array, superimposed upon a code wheel's quadrature track. The configurable photodetector array forms a photoactive area of the IC. Each photodetector may include either a photodiode or a phototransistor. For simplicity, a photodetector in the array is also referred to as a photo pixel, or a pixel, and the configurable photodetector array is also referred to as pixel array. The photodetector in the illustrated embodiment is merely an example, and is not intended to limit the present disclosure beyond what is explicitly recited in the claims. The principle of the present disclosure may also be applicable to a magnetic encoder. For example, a magnetic encoder system may have a configurable magnetic-field detector array to detect magnetic flux changes due to modulation from a moving object, such as a code wheel or a code stripe.

In an example pixel array, each pixel can be configured to any one of the quadrature assignments (i.e., A+, A−, B+, B−). This configuration can be done when the IC is powered up by reading from a pixel partition map stored in a memory module, such as a non-volatile memory. The configuration may also be updated on-the-fly. For example, in FIG. 5, the pixel in the top left corner is assigned B+ based on a pixel partition map fitted to a particular code wheel configuration, while when the IC is installed with a different code wheel, the pixel may be changed to A+, A−, or B−, depending on a different pixel partition map. Or, during an optical encoder operation, the system may determine to incrementally change the pixel map on-the-fly, and this particular pixel may be changed from B+ to A+, A−, or B−, together with some other pixels in the pixel array. Also, there can be more than one pixel array in the IC. In some embodiments, one or more tracks of the code wheel are aligned to one or more pixel arrays.

In some embodiments, pixels configured with the same quadrature assignments form photoactive regions in strip shapes. In some embodiments, the pixels configured with the same quadrature assignments form photoactive regions in mosaic shapes. The assignment of the pixels is typically a consideration of the code wheel's radius and PPR, and pixel array's shape, pixel numbers, and spacing. In some embodiments, the consideration of pixel assignment also includes installation misalignments between the IC and the code wheel. In furtherance of some embodiments, the consideration of pixel assignments includes correcting unbalanced currents or gains, such as due to installation misalignments.

A pixel array may have a rectangular shape, a square shape, or other shapes suitable. The shape of pixels may also be made non-homogeneous within the pixel array. Having different size/shape pixels may reduce total system noise. The rectangular, grid-based pixels may produce a small amount of noise compared with an ideally shaped detector that better matches the slit. Adjusting the shape to round, elliptical, or rounded corners may reduce overall noise. Further, changing the size of individual or groups of pixels may also improve system noise at the expected cost of increased layout complexity and increased modeling requirements to determine pixel mapping.

Figure 6:
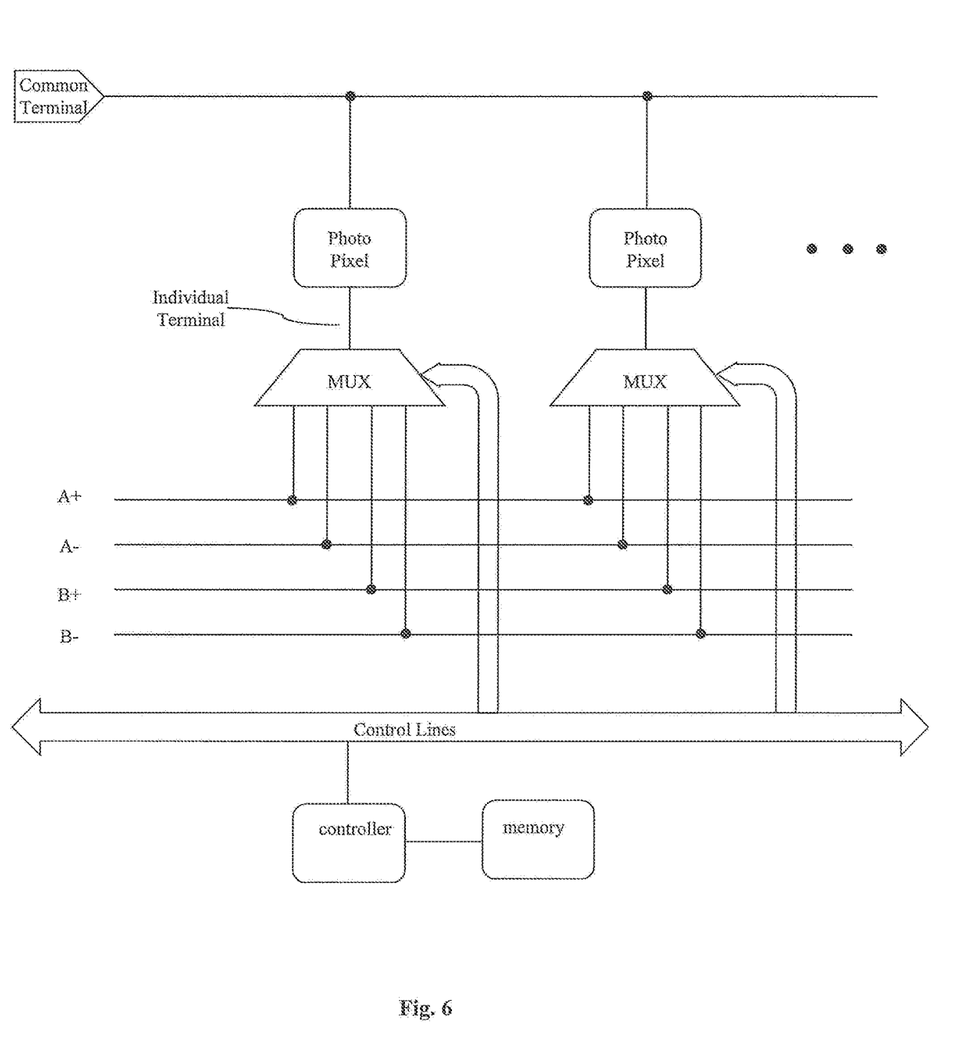
FIG. 6 shows an example schematic of quadrature assignment mechanism to photo pixels in a configurable photodetector array, in accordance with some embodiments.

A pixel array may include a plurality of pixels and a plurality of lumped current-mode outputs. Referring to FIG. 6, each pixel includes a photoactive area with at least two electrical terminals, in which current flows between the first terminal (connected to all pixels in the array, also as common terminal) and the second terminal (unique to each pixel, also as individual terminal) in proportion to the optical power incident to the photoactive area. The second terminal is coupled to an electrical switch (e.g., MUX). The electrical switch receives configuration bits from control lines (e.g., a bus line, or an SRAM word line) and routes the individual terminal of the photoactive area to one of the lumped current-mode outputs, no more than one of which is routed to the individual terminal at any given time. In this way, each lumped current-mode output carries current equal to the sum of the photocurrents in the photoactive areas of all pixels whose switches to that output are closed. One or more memory bits are used to select which electrical switch, if any, is to be closed, along with any circuitry and connections used to control the switches appropriately based on the states of the memory bits.

The pixels in a pixel array may be partitioned among the various lumped current-mode outputs based upon the configuration of the code wheel. Partitioning may be performed by writing to the memory bits to control the switches. The pattern for the pixels is based on the design of the code wheel in the system. In an example embodiment, a process of simulation or experimentation is used to determine the mapping for the pixels based on the code wheel radii and the slit pattern, which will be discussed in more detail below. The results are used by the system microcontroller to write into the memory of the ASIC to set each pixel to the correct region.

For example, a pixel array may contain 64 rows by 32 columns of pixels, a total of 2048 pixels. Each pixel requires two bits (e.g., SRAM bits) to associate it to one of the four lump quadrature track assignments. The system may use an 11-bit bus address to select a pixel, and an extra 2 bits to select one of the four lump quadrature track assignments.

In some embodiments, pixels can be set to off. An example solution sets each pixel to one of the 4 primary regions: A+, B+, A−, B−. It may be advantageous in some cases to turn individual pixels off. This may be performed pixel-by-pixel or based on entire rows or columns. This may allow the pixels to potentially more closely match the code wheel pattern. Further, this capability may allow better current balancing across the 4 main regions, simplifying the design of the downstream blocks in the ASIC like the transimpedance amplifiers (TIAs), filters, and comparators. One implementation to shut a pixel off is to add one more control bit to the MUX to select a status that none of the four lump current mode outputs are coupled to the individual terminal.

In some embodiments, pixels may be set to some intensity other than fully on. Normally pixels are fully on and assigned to one of 4 regions. Pixels may be set for partial intensity allowing a weighted current output, such as a half or quarter pixel to be used, or even zero (i.e., pixel is off) with extra one or more control bits. This intensity adjustment may potentially improve the mapping of pixels in a fixed pattern to the slits in a code wheel.

The lumped current outputs in this example are routed to transimpedance amplifiers (TIAs), such as four single ended TIAs or two differential TIAs. These amplifiers convert the current output from the pixel array into voltage signals that can be used for downstream processing. These TIAs are sized appropriately for the current outputs from the 4 blocks. In an embodiment, The TIAs may be highly linear in order to produce high-quality analog outputs for the quadrature tracks. In another embodiment, the TIAs are logarithmic, in order to accommodate a wide dynamic range of input (e.g., when analog quadrature-track outputs aren't needed). The transimpedance should be large enough to keep the angular position error introduced by the amplifier's own internal noise and offset of downstream comparators small, yet small enough to preserve good linearity at full-scale input current. Each TIAs' instance may have an adjustable current sink additive to its input, for offset compensation. The current sink value for a particular instance may be controlled by a control byte corresponding to that instance. The adjustable current sink may include latches in which to store the control bit(s) (e.g., a byte).

Figure 7:
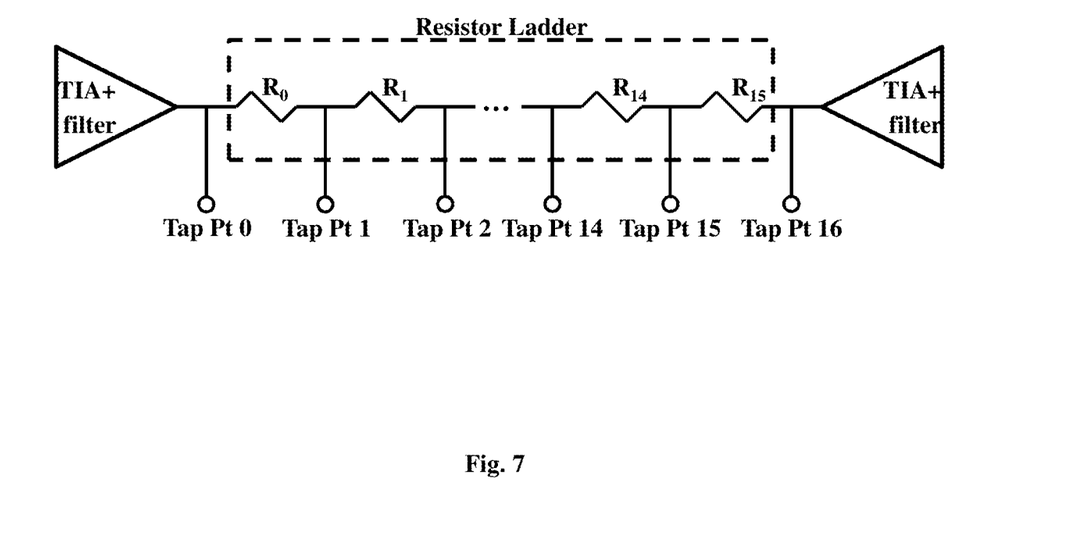
FIG. 7 shows an example circuit diagram of an example interpolator resistor ladder architecture that converts configurable photodetector array's readings into analog output with transimpedance amplifiers (TIAs), in accordance with an embodiment.

FIG. 7 shows a circuit diagram of an example interpolator resistor ladder architecture that converts configurable photodetector array's readings into analog output with transimpedance amplifiers (TIAs). This is merely an example. Other suitable implementations, such as other suitable number of interpolator resistors (≥2) and/or other suitable circuit topology, may also be used. In the illustrated embodiment, this block generates analog waveforms that are phase-shifted from the filtered A+/A−/B+/B− TIA output waveforms by between 0° and 90° in equal steps of 5.625°(=90°/16). By digitally comparing appropriate interpolated waveforms, square waves of up to 16× the frequency of the TIA outputs can be generated for this example embodiment. The block consists of four identical resistor ladders, each between the filtered outputs of two of the four quadrature-track TIAs (A+, A−, B+, B−): one between the B+and A− filtered TIA outputs, one between the A− and B− filtered TIA outputs, one between the B− and A+ filtered TIA outputs, and the fourth between the A+ and B+ filtered TIA outputs. Various other embodiments may be scaled as appropriate to provide any number of steps.

Figure 8:
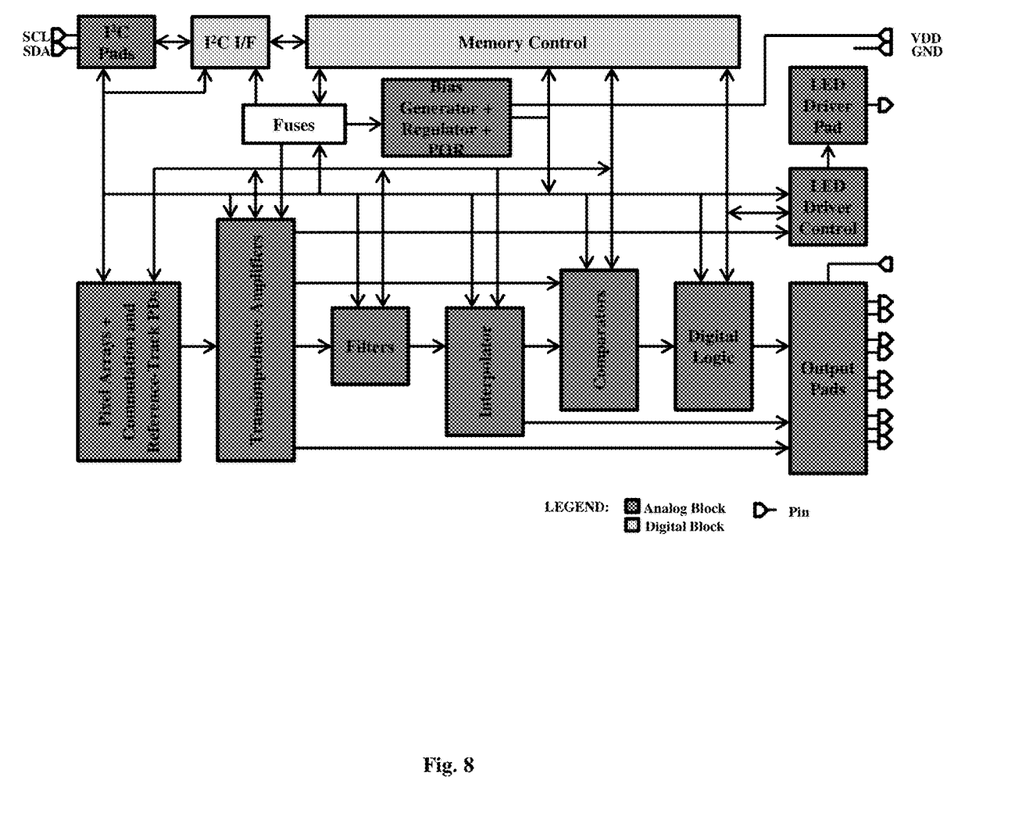
FIG. 8 illustrates a block diagram of an example optical encoder IC, in accordance with an embodiment.

FIG. 8 illustrates a block diagram of an example optical encoder IC. After the TIA, the system may optionally contain a filter to remove harmonics introduced by the non-ideal mapping of pixels to code wheel slits. The filter is not strictly required and can be inserted to improve overall performance. The non-ideal shape of the mapped pixels compared to a phase-array may cause some distortion of the signals. This filter may also be configurable to adapt different operating speeds of the code wheel. Much of this distortion can be corrected by applying a filter to reduce harmonics. Other elements in the block diagram include but not limited to interpolator, comparator, output drivers, and power supply. Optical encoders generally offer either digital or analog outputs and the pixel array enables both. In the case of analog outputs, the 4 channels are sent to an external ADC where they are sampled and sent to a signal processing chip/microcontroller to determine position and rate of change. Digital outputs can be made by running the analog signals through internal comparators in the ASIC to produce a quadrature binary output that does not require an external ADC. The capabilities of interpolation and decimation plus analog/digital outputs are common to many encoders and are not unique, nor are they restricted by the pixel array.

The encoder IC may also provide current control for the companion light emitter (e.g., an LED), either driving at a constant current over voltage/temperature or using feedback to provide a constant optical power density. Either the pixel array or a discrete detector may be used to monitor this feedback. This concept is not specific to the pixel array other than the potential use of a row or column to serve as the feedback mechanism. Furthermore, a combination of pixel dithering and LED current drive changes may provide improvement in detection of small changes.

Figure 9A:
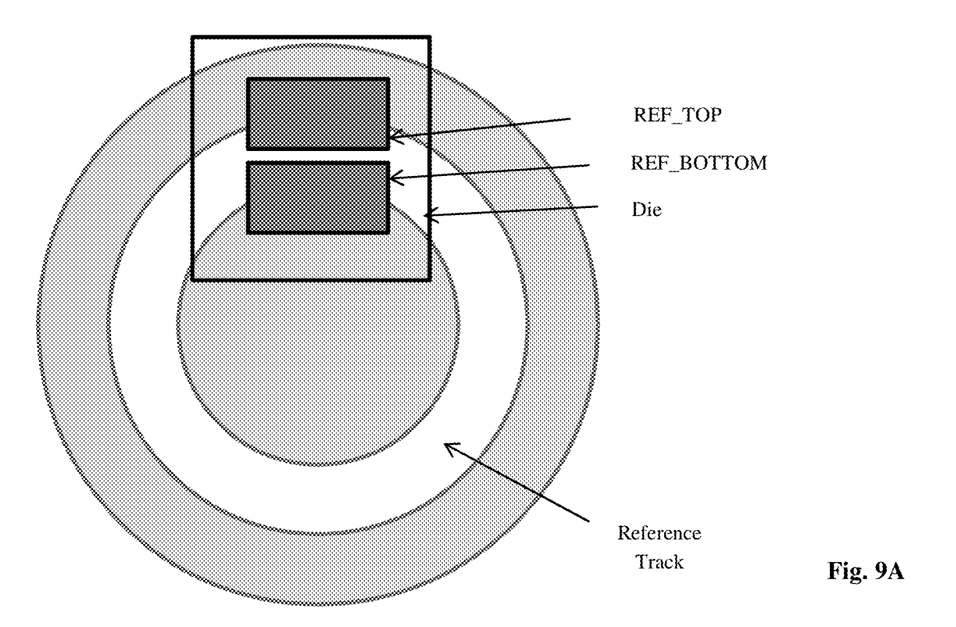
FIGS. 9A and 9B illustrate example techniques using the configurable photodetector array to implement alignment check between an optical encoder and a code wheel, in accordance with some embodiments.
Figure 9B:
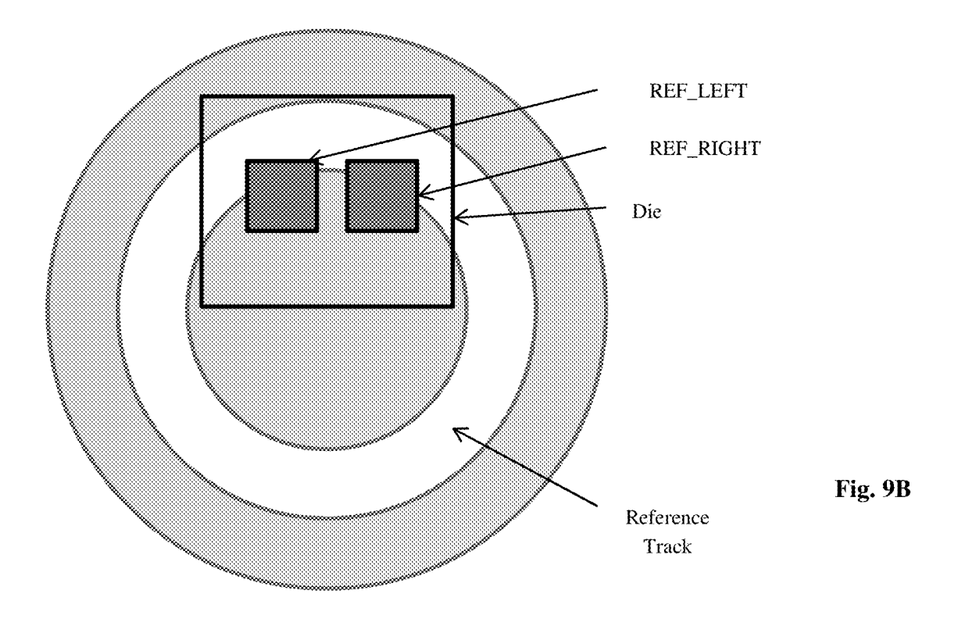

FIGS. 9A and 9B shows some extension usage to the pixel array, particularly an alignment check between an optical encoder and a code wheel, according to an example embodiment. The example pixel array may be used to either assist mechanical alignment of a system, or to remap pixels to provide an equivalent mechanical alignment, or both (or other). The pixels in the array may be set to a unique pattern during the manufacturing process to aid with alignment. Once the IC and PCB board have been locked in place mechanically, the pixel array pattern may be modified to further enhance performance. The theoretical pattern for the pixel array assumes perfect (or near-perfect) alignment between the array and the code wheel slits. The mechanical stackup (housing, PCB, chip placement, die placement in chip) may cause a non-trivial error. The in-situ performance of the system may be measured and a custom pixel pattern may be calculated and used for each unique system comprising mechanical and electrical components. Pixels may be mapped into a quarter or row configuration and the outputs from the regions compared while rotating the code disk. If the pixel array was off-center from the code wheel, the analog outputs from the 4 pixel channels would be unbalanced indicating to the operator that the array was mis-aligned and providing an indication of which direction to move to better align the ASIC with the code wheel.

FIG. 9A illustrates a pixel array may assign all or part of pixels into a ref_top region and a ref_bottom region, while non-assigned pixels outside these two regions may be turned off. The optical detector may determine the Y-direction misalignment by comparing the current difference between these two regions. Alternatively, in FIG. 9B, a pixel array may assign all or part of pixels into a ref_left region and a ref_right region. Again, by comparing current difference between these two regions, X-direction misalignment can be derived. After this misalignment calibration, the system may then tune the pixel partition map to compensate the misalignment. The misalignment can be measured by the pixel array or by a secondary (separate) pixel array. In some embodiment, the misalignment is measured by a set of separate optical sensors.

Pixels may potentially be dithered during run time. Normally pixels are set to a static configuration at startup. Having the ability to shift a pixel from one region to another or to off, may allow increased performance particularly at low rotation speeds. Dithering is often done in signal processing to help interpolate between adjacent values. This technique may be applied here. Such embodiment may employ a second memory to set pixels and the ability to switch between memories in a very short time. This may be accomplished by a second register and a mux to select.

Figure 10A:
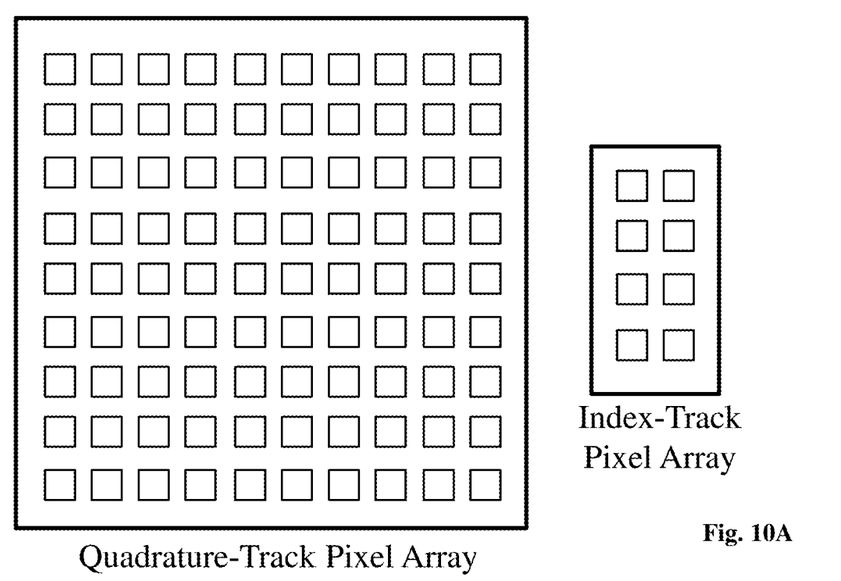
FIGS. 10A and 10B illustrate two example configurations of implementing a quadrature-track pixel array together with an index-track pixel array, in accordance with some embodiments.
Figure 10B:
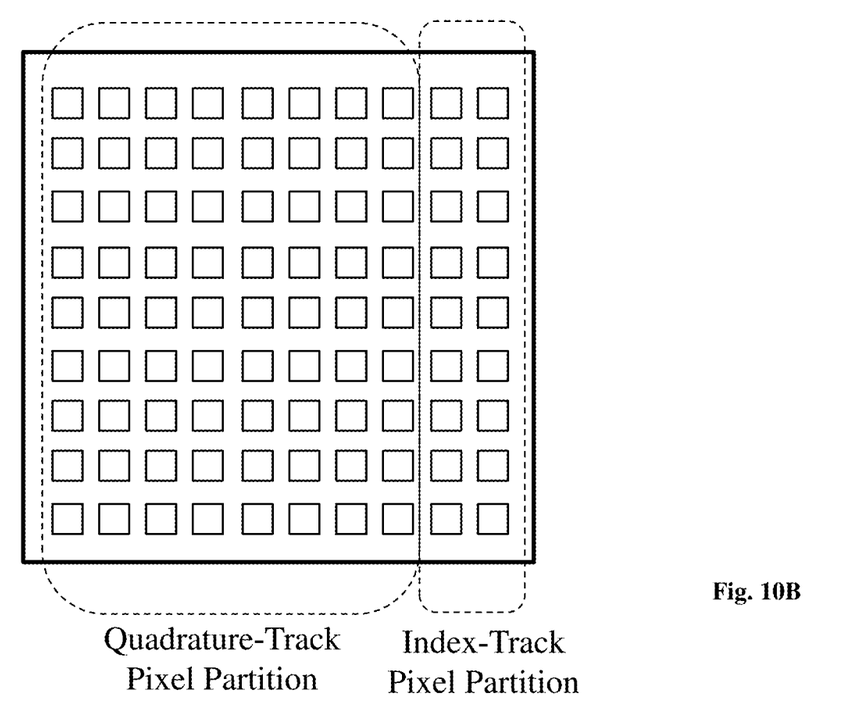

FIG. 10A shows a separate pixel array can be used for index track purposes. Traditional encoders have had separate code wheel tracks to provide index tracking: one pulse per revolution, or a one-third identification of the code wheel location. The separate array may be used for any of these purposes and may in some instances be used for index track separately from configuration. Alternatively, one pixel array can be partitioned into a quadrature-track pixel region and an index-track pixel region, as shown in FIG. 10B. Again, the index-track pixel region can be converted to part of a larger quadrature-track pixel region during run time, depending on system needs.

The optical encoder may be adapted for use in both transmissive and reflective architectures. The description here is for a transmissive design where the LED is on one side of the code wheel and the detector is on the other. In a reflective design, the LED sits on the same side with the detector IC, either on-chip or off-chip with the detector IC, and reflects light off the code wheel with reflective "slits" and non-reflective spaces. This provides a smaller customer design. The pixel array supports both transmissive and reflective architectures. In an exemplary reflective design, the LED is on the same die with the detector IC. In another exemplary reflective design, the LED and the detector IC are on two separate devices (e.g., two dies) but physically assembled together.

The concept can be applied to linear encoders as well as rotary. In a linear design, the equivalent of code slits would be on a linear axis and slide up/down the pixel array. The pixel array would work equally well in that scenario. For example, in a linear encoder embodiment the motion object may include pulses-per-length, as opposed to a rotary encoder that uses radius and PPR.

The pixels may be constructed with configurations accessed either from a random-access memory (RAM) or from a non-volatile memory (NVM). In the case of RAM, a host microcontroller may set each memory. Alternatively, the encoder ASIC may contain logic to read from an external NVM or an internal NVM and set the memory that way. Internal NVM may be programmable—i.e., flash, or may be a one-time-programmable memory. The pixels may also be set using a read-only memory (ROM) to store static pattern although that reduces the advantage of customer flexibility. Customers with sufficient volume may order a ROM pattern to eliminate the need to configure the memory at run time.

Figure 11:
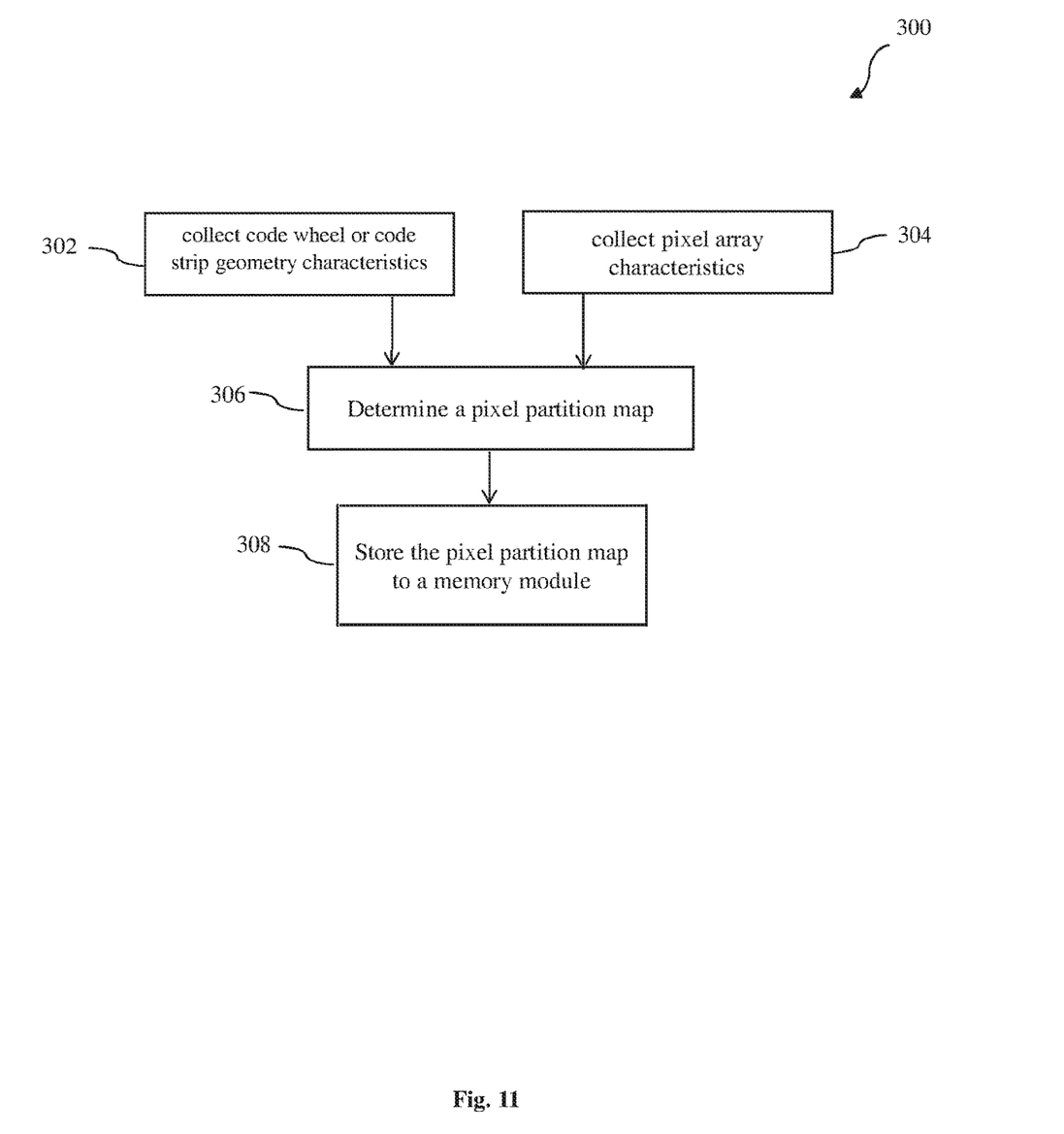
FIG. 11 shows a flowchart of an example method of determining a pixel partition map, in accordance with some embodiments.

FIG. 11 shows a flow chart of an example method 300 to determine a pixel partition map for configuring the pixel array. A physically separate computer system (e.g., a PC) and/or other microcontroller unit(s) may execute the operations of method 300 by reading code from a computer-readable medium and executing that code to provide the functionality discussed herein. In an example embodiment, method 300 is executed by a standalone computer system (e.g., a PC) during a manufacturing operation, rather than by the microcontroller unit in the encoder IC or during the encoder run time. At operation 302, code wheel geometry characteristics are collected from the setup of the code wheel, as stored in memory. The code wheel geometry characteristics may include wheel radii, PPR, and rotation speed (for example, as PPR increases, the mapping of the pixels may look increasingly less like a traditional phased-array configuration). Alternatively, if the motion object is a code strip instead of the code wheel, the geometry characteristics may include a pulse-per-length parameter of the code strip. At operation 304, pixel array characteristics are collected from the setup of the pixel array, as stored in memory. The pixel array characteristics include pixel array dimensions (e.g., row by column), pixel spacing, pixel shape, pixel size. The pixel array characteristics may include X-/Y-direction misalignment information in other embodiments.

At operation 306, the method 300 determines a pixel partition map. The determining of a pixel partition map may rely on calculating a threshold of different pixel partition maps, such as a threshold of an error deviation from 100% precision. When a candidate pixel partition map reaches the threshold, it may be selected as the final pixel partition map. At operation 308, the method 300 stores the pixel partition map to a memory module, such as the memory module in the encoder IC.

Figure 12:
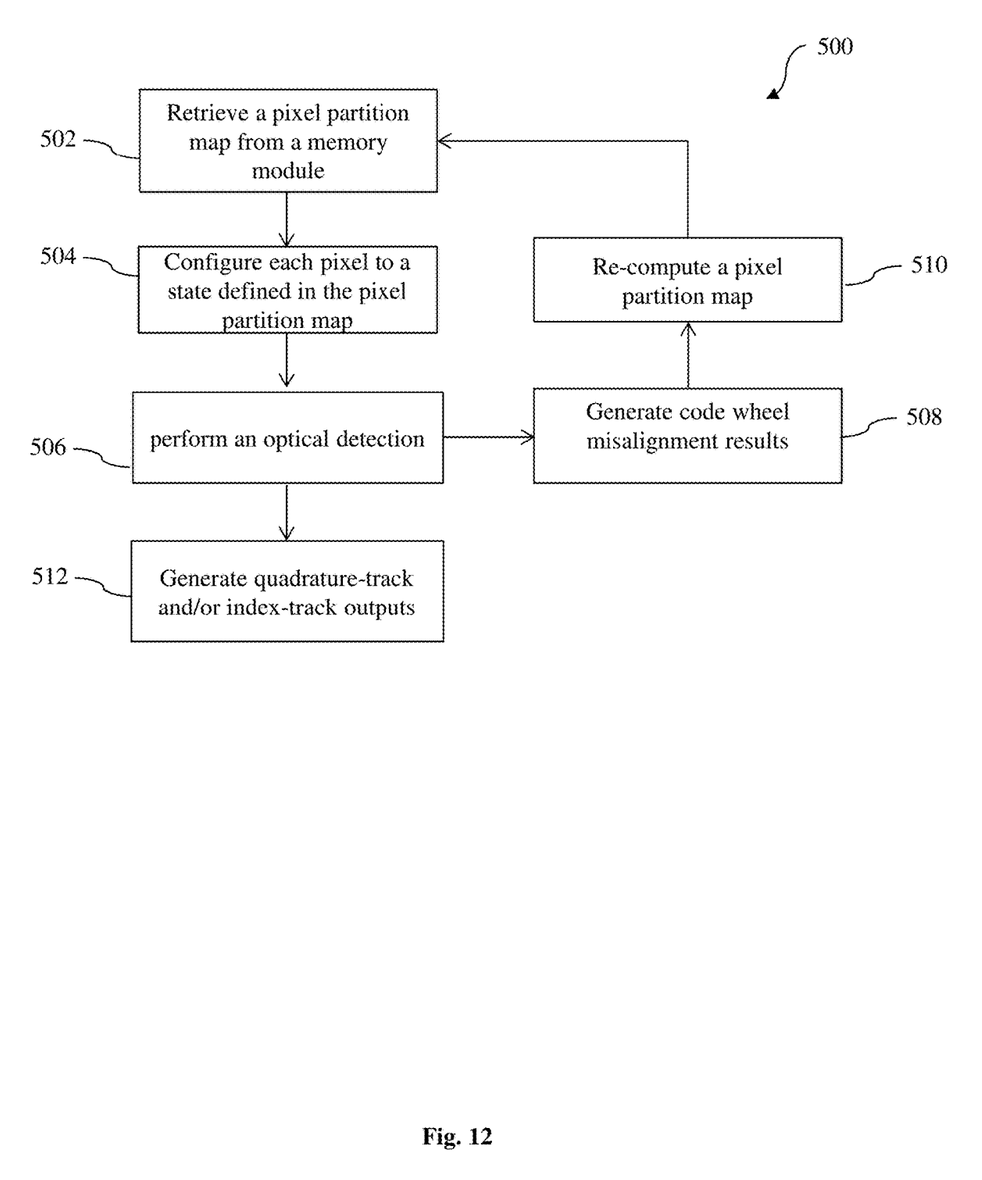
FIG. 12 shows a flowchart of an example method of operating an optical encoder with configurable photodetector array, in accordance with some embodiments.

FIG. 12 shows a flow chart of an example method 500 of operating an optical encoder with pixel array. A microcontroller or other processor of an encoder may execute the operations of method 500 by reading code from a computer-readable medium and executing that code to provide the functionality discussed herein. At operation 502, the optical encoder retrieves a pixel partition map from a memory module after a power up. In an embodiment, the optical encoder may run an internal state machine that reads an external non-volatile memory to load the map. At operation 504, each pixel in the pixel array is configured to a state defined in the pixel partition map, for example the map defines each individual pixels into the four quadrants discussed above. For example, control signals may be applied to switches (e.g., multiplexors of FIG. 6) to couple each pixel with a respective current line. At operation 506, the optical encoder performs an optical detection, by collecting currents from different assigned regions on the pixel array in response to an light emitter that is modulated by a moving object, such as code slits rotating around a linear axis or sliding up/down a linear strip.

In some embodiments, the retrieved pixel partition map is for misalignment calibration purpose, and then the system may go into operation 508 that measures and generates misalignment results and followed by the operation 510 that re-computes a pixel partition map for formal operation usage and write into the memory module. Instead, the method 500 may go from operation 506 to operation 512 directly to generate digital or analog outputs, such as quadrature-track and/or index-track outputs, from the optical measurement.

Although not intended to be limiting, one or more embodiments of the present disclosure provide many benefits to an optical encoder using configurable photodetector array. As most conventional optical encoder designs use a fixed pattern phased array for detectors, such pattern exactly matches a code wheel, thus limiting the array to a specific size and PPR (pulse per revolution) code wheel. These conventional phase arrays (4 channels typically) are each routed to a dedicated amplifier channel.

In contrast, the pixel array described with respect to various embodiments may have configurable pixels that may be set by a memory to map to one of the four channels. The configurable pixels may be set either by a host microcontroller, using an internal non-volatile memory with a circuit to read and set, or by using a masked ROM where the pixels are set in some factory alignment configuration. However, various embodiments may use any appropriate processor or memory. Furthermore, in-system configurability is possible for some embodiments. Encoder manufacturers may apply a patch in the field, updating the pixel map after the product has been installed in the field. This patch may improve or otherwise change performance characteristics.

Also, the lack of a visible phased-array pattern makes the design less susceptible to cloning. Traditionally, a regular phased-array can be observed under a microscope to determine size of features thus allowing a competitor to copy the design. The pixel array does not have any indication of mapping thus requiring the I²C or other protocol stream to be interrupted in order to determine which pixels are mapped to which quadrant. This would be considerably more difficult to copy.

Moreover, the configurable pixel arrays may also allow a customer to use same IC to develop a product portfolio of difference performance levels, for example by setting different thresholds in operation 306 of method 300 (FIG. 11) to limit an optical encoder's precision level. Therefore, encoder manufacturers may provide different performance/price points with a common set of hardware including code wheel. Remapping the pixel array with a common code wheel may allow different performance of the resulting system. Encoder manufacturers may offer higher or lower price points based on performance with identical hardware thus allowing them to market their products differently.

The principle of the present disclosure may also be applicable to a magnetic encoder as to an optical encoder. For example, in a magnetic encoder, instead of a configurable photodetector array including a plurality of photodetectors, the system may have a configurable magnetic-field detector array including a plurality of magnetic detectors. A magnetized part in the emitter generates a magnetic flux. The configurable magnetic-field detector detects changes of the magnetic flux modulated by the moving object, such as a code wheel or a code stripe. The other aspects of the magnetic encoder are similar to what have been described above in the optical encoder and omitted here for the sake of simplicity.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An encoder system, comprising:
   a configurable detector array including a plurality of detectors in communication with a plurality of current lines via a set of multiplexors, each of the current lines associated with a respective quadrature state;
   a memory operable to store a partition map that defines quadrature states for the detectors;
   a controller operable to read from the memory the partition map and to configure the configurable detector array according to the partition map by controlling the multiplexors to assign each of the detectors to a respective current line; and
   an emitter operable to generate a flux modulated by a motion object, wherein the configurable detector array is operable to receive the flux and generate respective current outputs for each of the detectors in response to the flux.

2. The encoder system of claim 1, wherein:
   the configurable detector array comprises a configurable photodetector array;
   the plurality of detectors comprises a plurality of photodetectors;
   the emitter comprises a light emitter; and
   the flux comprises a light flux.

3. The encoder system of claim 1, wherein:
the configurable detector array comprises a configurable magnetic detector array;
the plurality of detectors comprises a plurality of magnetic detectors;
the emitter includes a magnetized part; and
the flux comprises a magnetic flux.

4. The encoder system of claim 1, wherein the partition map further defines a state of OFF for some of the detectors.

5. The encoder system of claim 1, wherein the motion object comprises a code wheel having a radius and a parameter of pulses per revolution (PPR).

6. The encoder system of claim 5, wherein the partition map is determined by at least the radius, the parameter of PPR, and a shape of the detectors.

7. The encoder system of claim 6, wherein the partition map is further determined by an array dimension and a pixel spacing of the configurable detector array.

8. The encoder system of claim 1, wherein the controller reconfigures the configurable detector array during a detection operation of the encoder system.

9. A method of operating an optical encoder system, comprising:
retrieving a partition map from a memory, wherein the partition map is computed based on geometry information of a motion object;
configuring a configurable photodetector array based on the partition map, wherein each photodetector in the configurable photodetector array is assigned a state by the partition map, including multiplexing respective outputs from individual photodetectors according to respective assigned states of the individual photodetectors;
performing an optical detection by measuring current outputs from the photodetectors, wherein the current outputs correspond to light modulated by the motion object; and
generating optical encoder outputs based on the optical detection.

10. The method of claim 9, wherein performing the optical detection includes summing current outputs from ones of the photodetectors that are assigned a same state.

11. The method of claim 10, wherein the current outputs are weighted in the sum.

12. The method of claim 10, wherein at least one of the current outputs is weighted as zero.

13. The method of claim 9, wherein each state is one of a plurality of quadrature states or OFF.

14. The method of claim 9, wherein:
the motion object comprises a code wheel; and
the geometry information of the motion object comprises a radius and a parameter of pulses per revolution (PPR) of the code wheel.

15. The method of claim 9, wherein:
the motion object comprises a code strip; and
the geometry information of the motion object comprises a pulses-per-length of the code strip.

16. The method of claim 9, wherein configuring the configurable photodetector array is performed after an installation of the optical encoder system associated with the motion object.

17. An optical encoder system, comprising:
a light emitter emitting a light flux;
a plurality of photodetectors in an array, wherein each photodetector is operable to generate a current in response to the light flux, and wherein each photodetector has a changeable quadrature state assignment;
a first means for modulating the light flux;
a second means for multiplexing outputs of the individual photodetectors according to state assignment; and
a third means for grouping currents generated by the plurality of photodetectors having a same state assignment.

18. The optical encoder system of claim 17, wherein the first means includes a moving object that interferes with the light flux.

19. The optical encoder system of claim 17, further comprising fourth means for computing the changeable quadrature state assignment associated with a misalignment measurement.

20. The optical encoder system of claim 17, wherein the third means includes means for assigning a respective weight to currents generated by each of the photodetectors.

* * * * *